(12) United States Patent
Lyons et al.

(10) Patent No.: US 8,710,487 B2
(45) Date of Patent: Apr. 29, 2014

(54) COLOR STABLE MANGANESE-DOPED PHOSPHORS

(75) Inventors: Robert Joseph Lyons, Burnt Hills, NY (US); Anant Achyut Setlur, Niskayuna, NY (US); Anirudha Rajendra Deshpande, Twinsburg, OH (US); Ljudmil Slavchev Grigorov, Sofia (BG)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/561,192

(22) Filed: Jul. 30, 2012

(65) Prior Publication Data
US 2012/0299466 A1 Nov. 29, 2012

Related U.S. Application Data

(62) Division of application No. 13/069,756, filed on Mar. 23, 2011, now Pat. No. 8,252,613.

(51) Int. Cl.
*H01L 33/50* (2010.01)
(52) U.S. Cl.
USPC .............................................. 257/13; 257/79
(58) Field of Classification Search
USPC ..................................................... 257/13, 79
See application file for complete search history.

(56) References Cited

U.S. PATENT DOCUMENTS

| 7,358,542 | B2 | 4/2008 | Radkov et al. |
| 7,497,973 | B2 | 3/2009 | Radkov et al. |
| 7,648,649 | B2 | 1/2010 | Radkov et al. |
| 7,847,309 | B2 | 12/2010 | Radkov et al. |
| 2009/0020775 | A1 | 1/2009 | Radkov et al. |
| 2010/0091215 | A1 | 4/2010 | Fukunaga et al. |
| 2010/0142189 | A1 | 6/2010 | Hong et al. |

FOREIGN PATENT DOCUMENTS

| GB | 1360690 | 7/1974 |
| JP | 2010209311 A | 9/2010 |
| JP | 2010209331 A | 9/2010 |
| WO | WO2012015581 A1 | 2/2012 |

OTHER PUBLICATIONS

Kasa et al., "Photoluminescent Properties of Cubic K2MnF6 Particles Synthesized in Metal Immersed HF/KMnO4 Solutions", Journal of Applied Physics, vol. 108, pp. 113503-1 to 113503-6, 2010.
Adachi et al., "Direct Synthesis and Properties of K2SiF6:Mn4+ Phosphor by Wet Chemical Etching of Si Wafer", Journal of Applied Physics, vol. 104, pp. 023512-1 to 023512-3, 2008.
Takahashi et al., "Mn4+—Activated Red Photoluminescence in K2SiF6 Phosphor", Journal of the Electrochemical Society, vol. 155, No. 12, pp. E183 to E188, 2008.

*Primary Examiner* — Long Pham
(74) *Attorney, Agent, or Firm* — Mary Louise Stanford

(57) ABSTRACT

A lighting apparatus capable of emitting white light includes a semiconductor light source; and a phosphor material radiationally coupled to the light source. The phosphor material includes a color-stable $Mn^{+4}$ doped phosphor prepared by a process including providing a phosphor of formula I;

$$A_x[MF_y]:Mn^{+4} \qquad I$$

and contacting the phosphor in particulate form with a saturated solution of a composition of formula II in aqueous hydrofluoric acid;

$$A_x[MF_y]; \qquad II$$

wherein
A is Li, Na, K, Rb, Cs, $NR_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is the absolute value of the charge of the $[MF_y]$ ion; and
y is 5, 6 or 7. In particular embodiments, M is Si, Ge, Sn, Ti, Zr, or a combination thereof.

10 Claims, 3 Drawing Sheets

COLOR STABLE MANGANESE-DOPED PHOSPHORS

CROSS-REFERENCE TO RELATED APPLICATIONS

This application is a divisional of prior U.S. application Ser. No. 13/069,756, filed on Mar. 23, 2011, now copending, the entire disclosure of which is incorporated herein by reference.

STATEMENT REGARDING FEDERALLY SPONSORED RESEARCH AND DEVELOPMENT

This invention was made with Government support under contract number DOE DE-EE0003251 awarded by the U.S. Department of Energy. The Government has certain rights in the invention.

BACKGROUND

Solid state lighting based on phosphor downconversion of InGaN LEDs have have begun to replace traditional fluorescent and incandescent lamps. These colored semiconductor light emitting devices, including light emitting diodes and lasers (both are generally referred to herein as LEDs), have been also produced from Group III-V alloys such as gallium nitride (GaN). Light emitted from InGaN-based LEDs is generally in the UV and/or blue range of the electromagnetic spectrum. Light emitted from the LED is converted to light that is useful for illumination purposes by coating or covering the LED with a phosphor layer. By interposing a phosphor excited by the radiation generated by the LED, light of a different wavelength, e.g., in the visible range of the spectrum, may be generated. Colored phosphors produce custom colors and higher luminosity, and, in combination with LED generated light, phosphor generated light may be used to produce white light. The most popular white LEDs are based on blue emitting InGaN chips. The blue emitting chips are coated with a phosphor or blend of phosphors that converts some of the blue radiation to a complementary color, e.g. a yellow-green emission. LEDs that emit in the near UV region (405 nm) are coated with a phosphor blend that includes a blue or blue green phosphor and a red emitter. The total of the light from the phosphor and the LED chip provides a color point with corresponding color coordinates (x and y) and correlated color temperature (CCT), and its spectral distribution provides a color rendering capability, measured by the color rendering index (CRI).

The production of light from LEDs and other light sources typically generates heat as a byproduct. Phosphors exposed to higher temperatures may have decreased quantum efficiency. As the quantum efficiency of different phosphors changes at different rates as temperature increases, the light emitted by the device may dim or the color may shift as the device enters steady state operation. In addition, some phosphors undergo hydrolysis reactions at an appreciable rate under conditions of elevated temperature and humidity. Thus, there is a continued demand for stable phosphor compositions that may be used as components, individually or as part of a phosphor blend, in the manufacture of LED-based lighting systems. Such materials would allow a wider array of light sources with desirable properties including good color quality (CRI>80), a large range of color temperatures, and a relative insensitivity to temperature changes.

Red line emitting $Mn^{+4}$ doped phosphors have been used in phosphor blends. However, many of these materials exhibit some instability in high temperature, high humidity environments. Therefore, it is desirable to develop new methods to improve the stability of the phosphors.

BRIEF DESCRIPTION

Accordingly, in one aspect, the present invention relates to processes for preparing color stable $Mn^{+4}$ doped phosphors. The process includes providing a phosphor of formula I;

$$A_x[MF_y]:Mn^{+4} \qquad \qquad I$$

and contacting the phosphor in particulate form with a saturated solution of a composition of formula II in aqueous hydrofluoric acid;

$$A_x[MF_y]; \qquad \qquad II$$

wherein
A is Li, Na, K, Rb, Cs, $NR_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is the absolute value of the charge of the $[MF_y]$ ion; and
y is 5, 6 or 7.

In particular embodiments, M is Si, Ge, Sn, Ti, Zr, or a combination thereof.

In another aspect, the present invention relates to color-stable $Mn^{+4}$ doped phosphors prepared by a process according to the present invention, and phosphor blends that contain the color-stable $Mn^{+4}$ doped phosphors.

In yet another aspect, the present invention relates to a lighting apparatus capable of emitting white light. The lighting apparatus includes a semiconductor light source; and a phosphor composition radiationally coupled to the light source, and which includes a color stable $Mn^{+4}$ doped phosphor according to the present invention.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
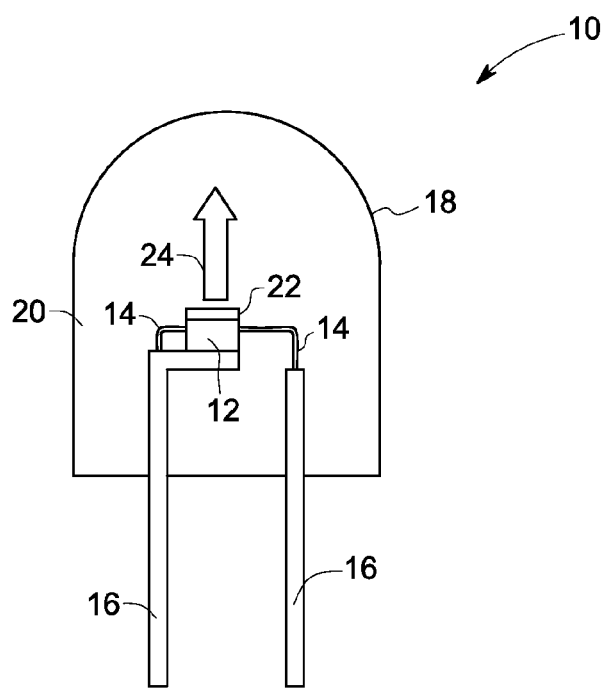
FIG. 1 is a schematic cross-sectional view of a lighting apparatus in accordance with one embodiment of the invention.

Oxidation of manganese in $Mn^{+4}$ doped phosphors in the presence of water may result in formation of manganese oxides/hydroxide brown color bodies, reducing light emitting efficiency of the phosphor. Although the inventors do not wish to be held to any particular theory, it is believed that the processes of the present invention remove at least some of the manganese from the surface of the phosphor particles, minimizing contact of the Mn$^{+4}$ with water under operating conditions in a lighting apparatus.

Examples of color stable phosphors of formula I include $K_2[SiF_6]:Mn^{4+}$, $K_2[TiF_6]:Mn^{4+}$, $K_2[SnF_6]:Mn^{4+}$, $Cs_2[TiF_6]$, $Rb_2[TiF_6]$, $Cs_2[SiF_6]$, $Rb_2[SiF_6]$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular, the Mn$^{+4}$ doped phosphor of formula I is $K_2SiF_6:Mn^{+4}$. and the composition of formula II is $K_2SiF_6$.

The nominal amount of manganese in the Mn$^{+4}$ doped phosphors of formula I typically ranges from about 1 mol % to about 16 mol %, based on total moles of the phosphor, particularly from about 2 mol % to about 12 mol %, more particularly from about 8 mol % to about 12 mol %. "Nominal amount" means the amount of manganese used the preparation of the phosphor. The actual amount of manganese incorporated in the phosphor may be less than the nominal amount, typically ranging from about 1 mol % to about 6 mol %, particularly from about 2 mol % to about 6 mol %. For example, a $K_2[SiF_6]:Mn^{4+}$ (PFS) phosphor prepared with a nominal amount of 8 mol % manganese may actually contain only about 2 mol % manganese. The actual amount of manganese may be tuned by adjusting the nominal amount until desired properties of the phosphor are achieved.

In the processes of the present invention, temperature at which the phosphor in particulate form is contacted with a saturated solution of a composition of formula II may range from about 20° C. to about 50° C. The period of time required to produce the color stable phosphor ranges from about one minute to about five hours, particularly from about five minutes to about one hour.

Concentration of hydrofluoric acid in the aqueous solutions used in the processes of the present invention typically ranges from about 20% w/w to about 70% w/w, particularly about 40% w/w to about 70% w/w. Less concentrated solutions may result in lower yields of the phosphor.

The Mn$^{+4}$ doped phosphor for treatment with the saturated solution of the composition of formula II may be prepared by any suitable process. For example, U.S. Pat. Nos. 7,497,973 and 7,648,649 describe synthesis of several phosphors of formula I. In some embodiments of the present invention, the phosphor is prepared by providing a solution of the phosphor of formula I in aqueous hydrofluoric acid at a temperature greater than about 60° C., and cooling the solution to a temperature less than about 30° C., causing the phosphor to precipitate. In other embodiments, the phosphor is prepared by maintaining a solution of the phosphor in aqueous hydrofluoric acid at a temperature ranging from about 25° C. to about 120° C. while evaporating the solvent of the solution. Other solvents may be included in the solution if desired, such as alcohols or acetone. The evaporation is carried out room temperature (about 20-25° C.) in some embodiments.

In another embodiment, the phosphor is prepared by providing a first aqueous hydrofluoric acid solution that includes a compound of formula III and a compound of formula IV.

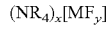    III

    IV

This solution is combined with a second aqueous hydrofluoric acid solution containing excess A$^+$ ions. The term "excess A$^+$ ions" means greater than the stoichiometric amount of A$^+$ ions, or, in other words, greater than the amount of A$^+$ ions necessary for a 100% yield of the phosphor. In some embodiments, a 500% excess may be used, although a greater or lesser amount may be used. The high concentration of the A$^+$ ions causes the formation of the host material of formula II and precipitation of the phosphor simultaneously. Both salts become supersaturated because the excess A$^+$ Ion suppresses solubility by the "common ion effect". In particular embodiments, A is K, Na, or a combination thereof. In some embodiments, the compound of formula III is $(NR_4)_2[MF_6]$ and the compound of formula IV is $A_2[MnF_6]$. More particularly, A is K, the Mn$^{+4}$ doped phosphor is $K_2SiF_6:Mn^{+4}$ and the compound of formula III is $(NH_4)_2SiF_6$, and the compound of formula IV is $K_2MnF_6$.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \le i$, $0 \le j$; $0 \le k$ and $I+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and phosphor blend 22, which contains a Mn$^{+4}$ doped phosphor according to the present invention. Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame. In some embodiments, the LED chip 12 is mounted in a reflective cup (not shown). The cup may be made from or coated with a reflective material, such as alumina, titania, or other dielectric powder known in the art, particularly alumina.

Lighting apparatus 10 includes phosphor blend 22, radiationally coupled to the LED chip 12. Radiationally coupled means that the elements are associated with each other so radiation from one is transmitted to the other. Phosphor blend 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor blend 22 and LED 12. Thus, phosphor blend 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in some embodiments, the median particle size of the phosphor composition ranges from about 1 to about 25 microns, particularly from about 15 to about 20 microns.

In other embodiments, phosphor blend 22 is interspersed within the encapsulant material 20, instead of being formed directly on the LED chip 12. The phosphor (in the form of a powder) may be interspersed within a single region of the encapsulant material 20 or, more preferably, throughout the entire volume of the encapsulant material. Blue light emitted by the LED chip 12 mixes with the light emitted by phosphor blend 22, and the mixed light appears as white light. If the phosphor is to be interspersed within the material of encapsulant 20, then a phosphor powder may be added to a polymer precursor, loaded around the LED chip 12, and then the polymer precursor may be cured to solidify the polymer material. Other known phosphor interspersion methods may also be used, such as transfer loading.

In yet another embodiment, phosphor blend 22 is coated onto a surface of the shell 18, instead of being formed over the LED chip 12. The phosphor composition is preferably coated on the inside surface of the shell 18, although the phosphor may be coated on the outside surface of the shell, if desired. Phosphor blend 22 may be coated on the entire surface of the shell or only a top portion of the surface of the shell. The UV/blue light emitted by the LED chip 12 mixes with the light emitted by phosphor blend 22, and the mixed light appears as white light. Of course, the phosphor may be located in any two or all three locations or in any other suitable location, such as separately from the shell or integrated into the LED.

Figure 2:
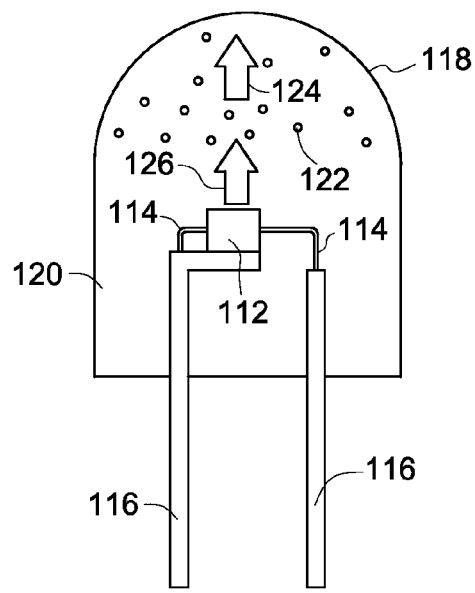
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor material 122 is interspersed within the encapsulant material 120, instead of being formed directly on the LED chip 112. The phosphor (in the form of a powder) may be interspersed within a single region of the encapsulant material or, more preferably, throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer precursor may then be cured to solidify the polymer. Other known phosphor interspersion methods may also be used, such as transfer molding.

Figure 3:
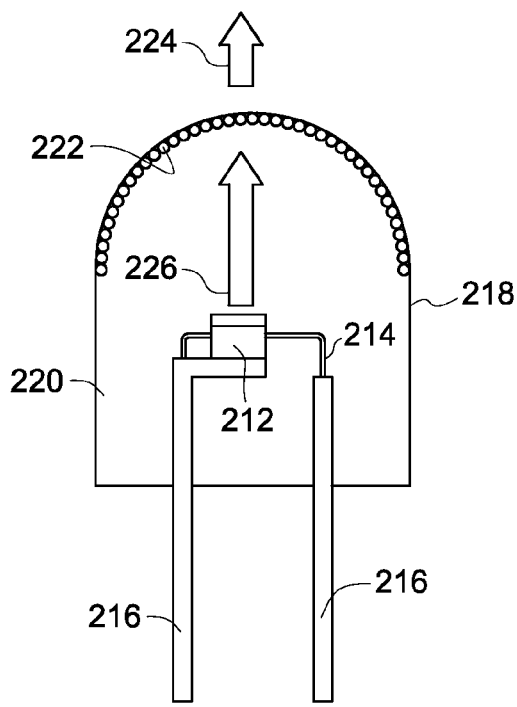
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor material 222 is coated onto a surface of the envelope 218, instead of being formed over the LED chip 212. The phosphor material 222 is preferably coated on the inside surface of the envelope 218, although the phosphor may be coated on the outside surface of the envelope, if desired. The phosphor 222 may be coated on the entire surface of the envelope, or only a top portion of the surface of the envelope. The radiation 226 emitted by the LED chip 212 mixes with the light emitted by the phosphor 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp 10 {as exemplified in FIG. 1) may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
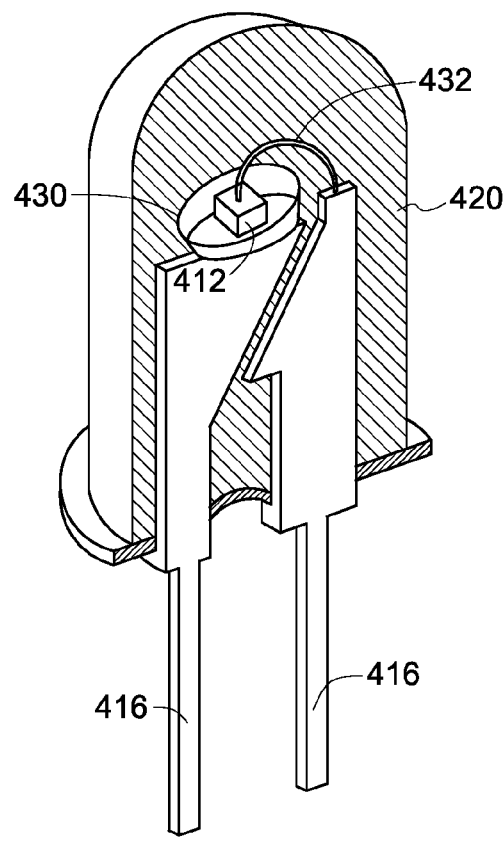
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a reflective material, such as alumina, titania, or other dielectric powders known in the art, particularly alumina. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
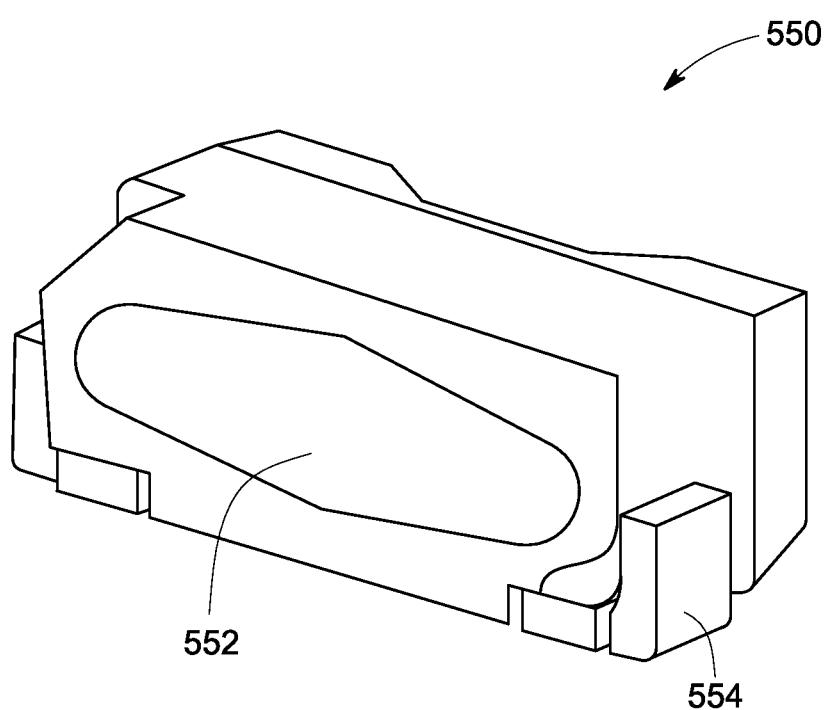
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. The SMD type light emitting diodes 550 can be made by disposing LEDs that have been formed beforehand by flow soldering or the like on a glass epoxy substrate, whereon an electrically conductive pattern has been formed and covering the LED with the window 552. An SMD package may comprise an LED chip as defined above, and a phosphor material that is excited by the light emitted from the LED chip.

When used with an LED emitting at from 350 to 550 nm and one or more other appropriate phosphors, the resulting lighting system will produce a light having a white color, the characteristics of which will be discussed in more detail below. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{+4}$ doped phosphor, phosphor blend 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, orange, or other color phosphors may be used in the blend to customize the white color of the resulting light and produce higher CRI sources. When used in conjunction with a LED chip emitting at from, e.g., 250 to 550 nm, the lighting apparatus preferably includes a blue phosphor for converting some, and preferably all, of the LED radiation to blue light, which in turn can then be efficiently converted by the color stable $Mn^{+4}$ phosphors and phosphor blends of the present invention. Suitable phosphors for use in phosphor blends according to the present invention include, but are not limited to, $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$; $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq 1$, $0<v\leq 0.1$, and $0\leq w\leq 0.2$); $(Y,Lu,Gd)_{2-\phi}Ca_\phi Si_4N_{6+\phi}C_{1-\phi}:Ce^{3+}$, (wherein $0\leq\phi\leq0.5$); $(Lu,Ca,Li,Mg,Y)$alpha-SiAlON doped with $Eu^{2+}$ and/or $Ce^{3+}$; $(Ca,Sr,Ba)SiO_2N_2:Eu^{2+},Ce^{3+}$; $3.5MgO*0.5MgF_2*GeO_2:Mn^{4+}$; $Ca_{1-c-f}Ce_cEu_fAl_{1+c}Si_{1-c}N_3$, (where $1<c\leq0.2$, $0\leq f\leq0.2$); $Ca_{1-h-r}Ce_hEu_rAl_{1-h}(Mg,Zn)_hSiN_3$, (where $0<h\leq0.2$, $0\leq r\leq0.2$); $Ca_{1-2s-t}Ce_s(Li,Na)_sEu_tAlSiN_3$, (where $0\leq s\leq0.2$, $0\leq f\leq0.2$, $s+t>0$); and $Ca_{1-\sigma-\chi-\phi}Ce_\sigma(Li,Na)_\chi Eu_\phi Al_{1+\sigma-\chi}Si_{1-\sigma+\chi}N_3$, (where $0\leq\sigma\leq0.2$, $0<\chi\leq0.4$, $0\leq\phi\leq0.2$)

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

When combined with a LED emitting at from 350-550 nm and, optionally, one or more additional phosphors, the use of a phosphor according to the present invention allows for a white LED device having a higher CRI value and lower CCT as compared to a cerium doped terbium aluminum garnet (TAG) based lighting device. LED devices having CCT values from about 2500 to about 10000, preferably from 2500 to 4500, and high CRI values from about 70 to 95 can be made. This allows for an increased ccx coordinate and a reduced ccy coordinate on the CIE color chromaticity diagram for the LED device, resulting in a "warmer" color LED.

The color stable $Mn^{+4}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

High Temperature, High Humidity (HTHH) Test Procedure

Powders are incorporated into a two-part silicone (RTV615, Momentive) with 50-75 wt % phosphor loading. These silicone/powder composites are then poured into Al plaque holders with a small indentation and emission and reflectance (versus a $BaSO_4$ standard) under 450 nm excitation are measured for each sample. Some of the plaques are reserved and stored under dry nitrogen as control samples. The other plaques are aged at about 80° C. at about 80% relative humidity, and after a fixed time, spectra of the exposed and control plaque intensities are re-measured. Comparison of the QE before and after aging is a measure of the degradation of the sample.

Example 1

Synthesis of PFS Phosphor (8 Mol % Mn) by Polythermal Crystallization

Hydrofluoric acid (49 wt %, 79 ml) was added to water (21 ml) to from a 40% HF solution in water, and then $K_2SiF_6$ (10 g, 0.454 moles) was added to the HF solution. The solution was heated to about 70-80° C., and $K_2MnF_6$ (1 g, 0.0040 moles) was added and stirred until dissolved. The solution was transferred to a cold bath composed of a half frozen 40 volume % isopropanol-water solution at −20° C. or a half frozen 58 volume % ethylene glycol water solution for −48° C. After the HF solution was cold, the HF-phosphor slurry was filtered through a medium porosity filter paper in a plastic funnel over a plastic beaker, washed with acetone, and air dried. The PFS phosphor was stored under an argon atmosphere.

Example 2

Preparation of $Mn^{+4}$ doped PFS phosphor by isothermal crystallization

Starting materials $K_2SiF_6$ and $K_2MnF_6$ (8 mol %) are dissolved in 70% HF at about 70° C. in plastic containers. While the solution was held at a constant 70° C. with stirring, the solvent was evaporated, leading to crystallization of the $Mn^{+4}$ doped PFS phosphor, nominally containing 8 mol % Mn. After solvent removal, the powder was washed with acetone to remove any residual HF and then vacuum filtered & dried.

Example 3

Preparation of $Mn^{+4}$ Doped PFS Phosphor

A first solution of $(NH_4)_2SiF_6$ (11.1 g, 0.454 moles) and $K_2MnF_6$ (1 g, 0.00395 moles, 8 mol %) in 49% aqueous HF (100 ml) was prepared at room temperature. A second solution containing KF (20 g) in 49% HF (50 ml) was cooled to about 0° C. The first solution was poured into the second solution with stirring, and the $Mn^{+4}$ doped PFS phosphor was precipitated. The precipitate was washed with acetone to remove any residual HF and then vacuum filtered & dried. Yield: 12.5 g $K_2[SiF_6]:Mn^{4+}$ (85%).

Example 4

Preparation of Color Stable $Mn^{+4}$ Doped PFS Phosphor

A saturated solution of $K_2SiF_6$ in 40% HF was prepared by adding $K_2SiF_6$ to 100 mL 40% HF in until no more could be dissolved (~1.75 g at room temperature). The phosphor powder from Example 3 was then added to the saturated solution. The resulting slurry was held at room temperature with stirring for about 15 minutes. The treated phosphor was allowed to settle and the 40% HF was decanted. Residual HF was removed by washing with dry acetone. The treated phosphor was then vacuum filtered and dried.

Example 5

HTHH Testing

The phosphors of Examples 3 and 4 were subjected to the HHTH test procedure described. After about 48 hours, the untreated phosphor of Example 2 had degraded, while the treated phosphor of Example 4 showed no degradation. QE of the treated sample was initially about 15-20% higher than QE of the untreated sample. In addition, body color of the untreated PFS appeared more orange and had reduced absorption in the visible range. After the HHTH treatment, QE of the untreated phosphor was about 31-33% of the initial value, while for the treated material, QE after HHTH was about 95% of the initial value. Results are shown in Table 1.

TABLE 1

|  | Initial QE | QE after 48 hrs, % |
|---|---|---|
| Example 3 | 80-85 | 27 |
| Example 4 | 100 | 95 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A lighting apparatus comprising
a semiconductor light source; and
a phosphor material radiationally coupled to the light source and comprising a color-stable $Mn^{+4}$ doped phosphor prepared by a process comprising
providing a $Mn^{+4}$ doped phosphor of formula I; and $A_x[MF_y]:Mn^{+4}$      I contacting the phosphor in particulate form with a saturated solution of a composition of formula II in aqueous hydrofluoric acid;

$A_x[MF_y]$;      II wherein
A is Li, Na, K, Rb, Cs, $NR_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is the absolute value of the charge of the $[MF_y]$ ion; and
y is 5, 6 or 7.

2. A lighting apparatus according to claim 1, wherein M is Si, Ge, Sn, Ti, Zr, or a combination thereof.

3. A lighting apparatus according to claim 1, wherein the compound of formula III is $(NR_4)_2[MF_6]$ and the compound of formula IV is $A_2[MnF_6]$.

4. A process according to claim 3, wherein the compound of formula III is $(NH_4)_2SiF_6$ and the compound of formula IV is $K_2MnF_6$.

5. A lighting apparatus according to claim 1, wherein providing the $Mn^{+4}$ doped phosphor comprises
providing a solution of the phosphor of formula I in aqueous hydrofluoric acid at a temperature greater than about 60° C.; and
cooling the solution to a temperature less than about 30° C.;
whereby the phosphor is precipitated from the solution in particulate form.

6. A lighting apparatus according to claim 1, wherein providing the providing the $Mn^{+4}$ doped phosphor comprises
providing an solution comprising the phosphor of formula I and aqueous hydrofluoric acid; and
maintaining the solution at a temperature ranging from about 25° C. to about 120° C. while evaporating solvent of the solution;
whereby the phosphor is precipitated from the solution in particulate form.

7. A lighting apparatus according to claim 1, wherein providing the $Mn^{+4}$ doped phosphor comprises
providing a first aqueous hydrofluoric acid solution comprising a compound of formula III and a compound of formula IV; and $(NR_4)_x[MF_y]$      III $A_x[MnF_y]$      IV combining the first solution with a second aqueous hydrofluoric acid solution comprising excess $A^+$ ions;
whereby the $Mn^{+4}$ doped phosphor is precipitated from the combined solutions in particulate form.

8. A lighting apparatus according to claim 7, wherein A is K, Na, or a combination thereof.

9. A lighting apparatus according to claim 7, wherein the compound of formula III is $(NR_4)_2[MF_6]$ and the compound of formula IV is $A_2[MnF_6]$.

10. A lighting apparatus according to claim 7, wherein the compound of formula III is $(NH_4)_2SiF_6$ and the compound of formula IV is $K_2MnF_6$.

* * * * *